(12) United States Patent
Hong et al.

(10) Patent No.: US 11,391,779 B2
(45) Date of Patent: Jul. 19, 2022

(54) BATTERY CAPACITY ESTIMATION APPARATUS AND METHOD, AND BATTERY MANAGEMENT APPARATUS PROVIDED WITH SAME AND METHOD THEREOF

(71) Applicant: LG CHEM, LTD., Seoul (KR)

(72) Inventors: Sung Ju Hong, Cheongju-Si (KR); Dong Hyun Kim, Sejong (KR); Seog Jin Yoon, Cheongju-Si (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 224 days.

(21) Appl. No.: 16/623,860

(22) PCT Filed: Sep. 18, 2018

(86) PCT No.: PCT/KR2018/010993
§ 371 (c)(1),
(2) Date: Dec. 18, 2019

(87) PCT Pub. No.: WO2019/074220
PCT Pub. Date: Apr. 18, 2019

(65) Prior Publication Data
US 2020/0132782 A1    Apr. 30, 2020

(30) Foreign Application Priority Data

Oct. 11, 2017  (KR) .................. 10-2017-0131671
Aug. 21, 2018  (KR) .................. 10-2018-0097417

(51) Int. Cl.
*H02J 7/00*      (2006.01)
*G01R 31/3842*   (2019.01)
*G01R 31/396*    (2019.01)

(52) U.S. Cl.
CPC ....... *G01R 31/3842* (2019.01); *G01R 31/396* (2019.01); *H02J 7/0048* (2020.01); *H02J 7/007182* (2020.01)

(58) Field of Classification Search
None
See application file for complete search history.

(56) References Cited

U.S. PATENT DOCUMENTS 7,554,296 B2 * 6/2009 Mizuno ............. G01R 31/3842
320/132
7,960,945 B1   6/2011 Onorato et al.
(Continued)

FOREIGN PATENT DOCUMENTS

CN    1437031 A    8/2003
CN    1829920 A    9/2008
(Continued)

OTHER PUBLICATIONS

European Search Report for European Patent Application No. 18865430.5 dated May 18, 2020.
(Continued)

*Primary Examiner* — Arun C Williams
(74) *Attorney, Agent, or Firm* — Birch, Stewart, Kolasch & Birch, LLP

(57) ABSTRACT

A battery capacity estimation apparatus including: a battery; a sensing unit connected to the battery to measure an OCV of the battery; an SOC estimation unit connected to the sensing unit to estimate an SOC of the battery using the OCV measured from the sensing unit; a memory unit storing data including the SOC and the OCV of the battery, the memory unit being connected to the SOC estimation unit; and an operation unit connected to the SOC estimation unit and the memory unit, the operation unit being configured to calculate an SOC reduction degree according to a use
(Continued)

voltage range change and re-calculate a changed SOC according to a changed use capacity.

20 Claims, 8 Drawing Sheets

(56) References Cited

U.S. PATENT DOCUMENTS

| | | | |
|---|---|---|---|
| 9,184,625 B1 | 11/2015 | Sauvage et al. | |
| 2008/0136378 A1 | 6/2008 | Iwahana et al. | |
| 2011/0080138 A1* | 4/2011 | Nakanishi | H02J 7/0016 |
| | | | 320/116 |
| 2012/0109248 A1 | 5/2012 | Danielsson et al. | |
| 2013/0257382 A1 | 10/2013 | Field et al. | |
| 2015/0046107 A1 | 2/2015 | Jo | |
| 2015/0127280 A1 | 5/2015 | Baba et al. | |
| 2015/0180257 A1 | 6/2015 | Snyder et al. | |
| 2015/0293183 A1 | 10/2015 | Tenmyo et al. | |
| 2016/0011269 A1 | 1/2016 | Wang et al. | |
| 2016/0084918 A1 | 3/2016 | Hongo | |
| 2018/0059192 A1* | 3/2018 | Seo | G01R 31/392 |

FOREIGN PATENT DOCUMENTS

| | | |
|---|---|---|
| CN | 101688899 A | 3/2010 |
| CN | 102695961 A | 9/2012 |
| CN | 104169733 A | 11/2014 |
| CN | 105403839 A | 3/2016 |
| CN | 107102263 A | 8/2017 |
| JP | 2004-42799 A | 2/2004 |
| JP | 2007-24673 A | 2/2007 |
| JP | 2014/10005 A1 | 1/2014 |
| JP | 2014-119265 A | 6/2014 |
| JP | 2016-65844 A | 4/2016 |
| JP | 2017-116518 A | 6/2017 |
| KR | 10-2014-0053590 A | 5/2014 |
| KR | 10-2015-0048439 A | 5/2015 |
| KR | 10-2016-0013419 A | 2/2016 |
| KR | 10-2016-0047157 A | 5/2016 |
| KR | 10-2016-0080380 A | 7/2016 |
| KR | 10-2017-0006400 A | 1/2017 |
| WO | WO 2014/083856 A1 | 6/2014 |
| WO | WO 2014/185163 A1 | 11/2014 |
| WO | WO 2016/129212 A1 | 8/2016 |

OTHER PUBLICATIONS

Guo Kai; "Research on Model-Based Lithium-Ion Battery SOC Estimation," Chinese Master's Theses Full-text Database Engineering Science and Technology II, Third Edition in 2014, Published on Feb. 16 to Mar. 15, 2014.

Wang et al., "Correlation between the model accuracy and model-based SOC estimation," Electrochimica Acta, vol. 228, 2017, pp. 146-159.

International Search Report for PCT/KR2018/010993 dated Dec. 21, 2018.

* cited by examiner

FIG. 3

| INDEX | SOC(%) | OCV(mV) |
|---|---|---|
| 1 | 100 | 4200 |
| 2 | 95 | 4110 |
| 3 | 90 | 4025 |
| 4 | 85 | 3900 |
| 5 | 80 | 3800 |
| 6 | 75 | 3750 |
| 7 | 70 | 3700 |
| 8 | 65 | 3680 |
| 9 | 60 | 3650 |
| 10 | 55 | 3630 |
| 11 | 50 | 3600 |
| 12 | 45 | 3580 |
| 13 | 40 | 3560 |
| 14 | 35 | 3540 |
| 15 | 30 | 3520 |
| 16 | 25 | 3500 |
| 17 | 20 | 3460 |
| 18 | 15 | 3400 |
| 19 | 10 | 3250 |
| 20 | 8 | 3100 |
| 21 | 6 | 2500 |
| 22 | 5 | 2400 |
| 23 | 3 | 2210 |
| 24 | 1 | 2100 |
| 25 | 0 | 2000 |

FIG. 4

| INDEX | SOC(%) | OCV(mV) |
|---|---|---|
| 1 | 100 | 4000 |
| 2 | 95 | 3900 |
| 3 | 84 | 3800 |
| 4 | 78 | 3750 |
| 5 | 73 | 3700 |
| 6 | 67 | 3680 |
| 7 | 61 | 3650 |
| 8 | 56 | 3630 |
| 9 | 50 | 3600 |
| 10 | 44 | 3580 |
| 11 | 39 | 3560 |
| 12 | 33 | 3540 |
| 13 | 28 | 3520 |
| 14 | 22 | 3500 |
| 15 | 16 | 3460 |
| 16 | 11 | 3400 |
| 17 | 10 | 3250 |
| 18 | 8 | 3100 |
| 19 | 5 | 2500 |
| 20 | 0 | 2400 |

BATTERY CAPACITY ESTIMATION APPARATUS AND METHOD, AND BATTERY MANAGEMENT APPARATUS PROVIDED WITH SAME AND METHOD THEREOF

TECHNICAL FIELD

The present invention relates to an apparatus and method for estimating the capacity of a battery, and more particularly, to an apparatus and method for estimating the capacity of a battery according to a reduction in the range of voltage used.

BACKGROUND ART

In recent years, as the demand for portable electronic products such as notebooks and portable telephones has increased sharply, studies on a high performance secondary battery capable of repeated charge and discharge (hereinafter referred to as a battery) have been actively conducted. Currently commercially available batteries include nickel cadmium batteries, nickel metal hydride batteries, nickel-zinc batteries, and lithium batteries. Among them, lithium batteries have less memory effect than nickel batteries, so that they are in the limelight for advantages, for example, free charge/discharge, very low self-discharge rate, high energy density, and the like.

On the other hand, as carbon energy is gradually depleted and environmental concerns are rising, demand for hybrid vehicles and electric vehicles is increasing. Since these hybrid vehicles and electric vehicles use the charge and discharge energy of a battery pack to obtain the vehicle driving power, they are more fuel-efficient than the vehicles using only the engine and do not discharge or reduce pollutants. Therefore, they are getting good responses from many consumers. Therefore, more attention and research are focused on automotive batteries, which are key components of hybrid vehicles and electric vehicles.

Since the battery is used for mobile devices without being connected to an external power source such as AC power, there is a time limit. However, if the usable time of the battery, i.e., the available time, may not be predicted properly, the user may experience a great deal of difficulty. For example, if the battery available time of an electric vehicle may not be accurately predicted, the battery may be completely discharged during operation, resulting in the vehicle stopping in the middle of the road.

In this way, in order to prevent sudden complete battery discharge during use when the user may not predict the discharge of the battery, a technique for estimating the remaining amount of the battery, that is, the state of charge (SOC), and providing it to the user is widely known. The SOC of the battery is generally expressed as a percentage of the remaining capacity of the battery with respect to the full charge capacity (FCC). As a method of estimating the SOC of the battery, various methods may be used. A representative method is a method of estimating the SOC using the current integration method. This current integration method is a mode in which SOC is obtained by integrating the input/output current of the battery and adding/subtracting it from the initial capacity.

On the other hand, when the battery pack is mounted on a vehicle or the like, the automobile manufacturer may change the usable voltage range in consideration of battery life and stability. For example, the available voltage range may be reduced from a minimum of 2.4V to a maximum of 4.0V with respect to a battery capable of operating from a minimum of 2.0V to a maximum of 4.2V. However, despite the reduction in usable capacity as the voltage range is reduced, it may not be to SOC and FCC calculation algorithms. That is, the initial residual amount estimation is not performed according to the use range reduction, and this causes a larger error over time.

PRIOR ART DOCUMENT

Korean Patent Publication No. 2014-0053590

DISCLOSURE OF THE INVENTION

Technical Problem

The present invention provides a battery capacity estimation apparatus and method capable of estimating a capacity of a battery according to a change in a use voltage range, and a battery management apparatus and method including the same.

The present invention provides a battery capacity estimation apparatus and method capable of estimating a capacity according to a reduced use voltage range using an initial capacity estimation through an OCV table, and a battery management apparatus and method including the same.

Technical Solution

In accordance with an exemplary embodiment, a battery capacity estimation apparatus includes: a battery; a sensing unit connected to the battery to measure an OCV of the battery; an SOC estimation unit connected to the sensing unit to estimate an SOC of the battery using the OCV measured from the sensing unit; a memory unit configured to store data including the SOC and the OCV of the battery, the memory unit being connected to the SOC estimation unit; and an operation unit connected to the SOC estimation unit and the memory unit, the operation unit being configured to calculate an SOC reduction degree according to a use voltage range change and re-calculate a changed SOC according to a changed use capacity.

The memory unit may match and store a plurality of initial SOCs and a plurality of initial OCVs, and may match and store a plurality of changed SOCs and a plurality of changed OCVs.

The operation unit may calculate a changed capacity by [Equation 1] below.

$$X'[mAh] = X[mAh] \times (1 - (A\% + B\%))  \quad \text{[Equation 1]}$$

where X' is a changed capacity, X is an initial capacity, A and B are high and low capacity subtraction ratios, respectively.

The operation unit may calculate a changed SOC by [Equation 2] below.

$$I'[\%] = \frac{(I\% - B\%)}{(100\% - (A\% + B\%))}  \quad \text{[Equation 2]}$$

where I' is a changed SOC, I is an initial SOC, A and B are high and low capacity subtraction ratios, respectively.

In accordance with yet another exemplary embodiment, a battery management apparatus includes: a battery; a sensing unit connected to the battery to measure an OCV of the battery; an SOC estimation unit connected to the sensing unit to estimate an SOC of the battery using the OCV measured from the sensing unit; a memory unit configured to store data including the SOC and the OCV of the battery, the memory unit being connected to the SOC estimation unit; an operation unit connected to the SOC estimation unit and the memory unit and configured to calculate an SOC reduction degree according to a use voltage range change and re-calculate a changed SOC according to a changed use capacity; a control unit connected to at least one of the operation unit and the memory unit to control charging and discharging of the battery according to a state of the battery by referring to the SOC; and a switching unit provided between the battery and a load to charge/discharge the battery according to a control signal of the control unit.

The operation unit may calculate a changed capacity by [Equation 1] below and calculate a changed SOC by [Equation 2] below $$X'[mAh]=X[mAh]\times(1-(A\%+B\%)) \qquad \text{[Equation 1]}$$

where X' is a changed capacity, X is an initial capacity, A and B are high and low capacity subtraction ratios, respectively.

$$I'[\%] = \frac{(I\% - B\%)}{(100\% - (A\% + B\%))} \qquad \text{[Equation 2]}$$

where I' is a changed SOC, I is an initial SOC, A and B are high and low capacity subtraction ratios, respectively.

In accordance with still another exemplary embodiment, a battery capacity estimation method includes: measuring an OCV of a battery; estimating an initial SOC according to the measured OCV; calculating a changed SOC after calculating a SOC reduction degree according to a use voltage range change; and calculating a changed OCV according to the changed SOC.

The method may further include matching and storing a plurality of initial SOCs of the battery and a plurality of initial OCVs according thereto.

The initial SOC may be estimated by matching the measured OCV and the initial OCV.

The calculating of the changed SOC may include: calculating a SOC change degree according to a use voltage range change; calculating a changed capacity by subtracting from the initial capacity by the SOC change degree; and calculating the changed SOC.

The changed capacity may be calculated by [Equation 1] below.

$$X'[mAh]=X[mAh]\times(1-(A\%+B\%)) \qquad \text{[Equation 1]}$$

where X' is a changed capacity, X is an initial capacity, A and B are high and low capacity subtraction ratios, respectively.

The changed SOC may be calculated by [Equation 2] below.

$$I'[\%] = \frac{(I\% - B\%)}{(100\% - (A\% + B\%))} \qquad \text{[Equation 2]}$$

where I' is a changed SOC, I is an initial SOC, A and B are high and low capacity subtraction ratios, respectively.

The method may further include storing a plurality of data by matching the changed SOC and the changed OCV.

In accordance with yet still another exemplary embodiment, a battery management method includes: measuring an OCV of a battery; estimating an initial SOC according to the measured OCV; calculating a changed SOC after calculating a SOC reduction degree according to a use voltage range change; calculating a changed OCV according to the changed SOC; and controlling charging/discharging of the battery according to the state of the battery with reference to the changed SOC.

The calculating of the changed SOC may include: calculating a SOC change degree according to a use voltage range change; calculating a changed capacity by subtracting from the initial capacity by the SOC change degree; and calculating the changed SOC.

The changed capacity may be calculated by [Equation 1] below and the changed SOC may be calculated by [Equation 2] below $$X'[mAh]=X[mAh]\times(1-(A\%+B\%)) \qquad \text{[Equation 1]}$$

where X' is a changed capacity, X is an initial capacity, A and B are high and low capacity subtraction ratios.

$$I'[\%] = \frac{(I\% - B\%)}{(100\% - (A\% + B\%))} \qquad \text{[Equation 2]}$$

where I' is a changed SOC, I is an initial SOC, A and B are high and low capacity subtraction ratios.

Advantageous Effects

Embodiments of the present invention may estimate the SOC and the capacity of a battery pack whose use voltage range has been changed according to the needs of a manufacturer installing the battery in an automobile or the like by using the OCV table. For example, according to the request of the manufacturer for the battery pack whose manufacture of the battery pack is completed and where the use voltage range is set, the use voltage range may be changed. In this case, after calculating the current SOC by referring to the OCV table, the degree of SOC reduction is calculated by referring to the OCV table for the upper and lower voltage use ranges, and the FCC capacity is calculated by deducting the amount of SOC reduction, and then a new SOC for the reduced use range is calculated. In such a way, it is possible to prevent the occurrence of an error by estimating the changed SOC according to the reduction of the voltage range, thereby enabling stable use of the battery.

BRIEF DESCRIPTION OF THE DRAWINGS

Exemplary embodiments can be understood in more detail from the following description taken in conjunction with the accompanying drawings, in which:

FIG. 3 is an exemplary view of an initial OCV table used in a SOC estimation method of a battery according to an embodiment of the present invention;

FIG. 4 is an exemplary view illustrating an OCV table changed according to a voltage range reduced by a SOC estimation method of a battery according to an embodiment of the present invention;

MODE FOR CARRYING OUT THE INVENTION

Hereinafter, embodiments of the present invention will be described in detail with reference to the accompanying drawings. However, the present invention may be embodied in different forms and should not be construed as limited to the embodiments set forth herein, and rather, these embodiments are provided so that this disclosure will be thorough and complete, and will fully convey the scope of the present invention to those skilled in the art.

Figure 1:
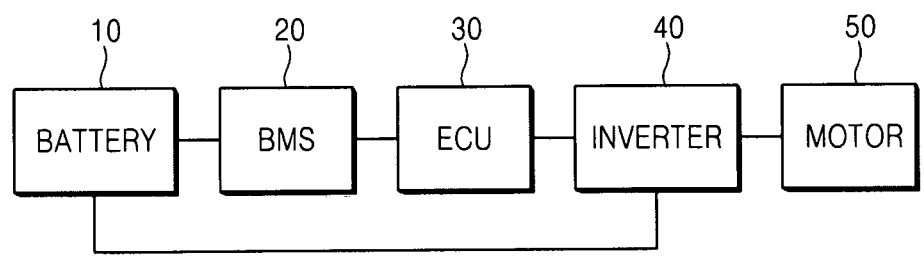
FIG. 1 is a schematic block diagram of an electric vehicle to which SOC estimation of a battery according to embodiments of the present invention is applied.

FIG. 1 is a schematic block diagram of an electric vehicle in which SOC estimation of a battery according to an embodiment of the present invention is used.

Referring to FIG. 1, the electric vehicle may include a battery 10 for providing electrical energy, a BMS 20 for managing the battery 10, an ECU 30 for controlling the state of the electric vehicle, an inverter 40 for driving the motor 50 so as to enable the electric vehicle to travel, and a motor 50 for driving the electric vehicle.

The battery 10 is an electric energy source that supplies a driving force to the motor 50 to drive the electric vehicle 1. The battery 10 may be charged or discharged by the inverter 40 in accordance with the driving of the motor 50 and/or the internal combustion engine (not shown). Here, the battery 10 may include at least one battery pack. Each of at least one battery pack may include a plurality of battery modules. The battery module may include a plurality of chargeable and dischargeable battery cells. The plurality of battery modules may be connected in series and/or in parallel in various ways to meet specifications of vehicles, battery packs, and the like, and a plurality of battery cells may also be connected in series and/or in parallel. Here, the type of the battery cell is not particularly limited and may be, for example, a lithium ion battery, a lithium polymer battery, a nickel cadmium battery, a nickel hydrogen battery, a nickel zinc battery, or the like.

The BMS 20 estimates the state of the battery 10 and manages the battery 10 using the estimated state information. For example, the status information of the battery 10 such as the SOC of the battery 10, the State of Health (SOH), the maximum input/output power allowable amount, and the output voltage is estimated and managed. Then, the charging or discharging of the battery 10 is controlled using such state information. The BMS 20 according to the present invention includes an SOC estimation apparatus for estimating an SOC of a battery. In addition, the BMS 20 controls cell balancing to balance the charge state of each battery cell. That is, a battery cell having a relatively high charge state may be discharged and a battery cell having a relatively low charge state may be charged.

An engine controller unit (ECU) 30 is an electronic control unit for controlling the state of an electric vehicle. For example, based on information such as an accelerator, a brake, a speed, and the like, torque degree is determined and the output of the motor 50 is controlled to match the torque information. Further, based on the state information of the SOC, SOH, etc. of the battery 10 transmitted by the BMS 20, the ECU 30 allows the battery 10 to be charged or discharged. For example, if the SOC delivered from the BMS 20 is 55% or less, the switch of the inverter 40 is controlled to output power in the direction of the battery 10 to charge the battery 10, and if the SOC is 55% or more, the switch of the inverter 40 is controlled to output power in the direction of the motor 50 to discharge the battery 10.

The inverter 40 drives the motor 50 so that the electric vehicle may travel on the basis of the control signal of the ECU 30.

The motor 50 drives the electric vehicle 1 based on the control information (e.g., torque information) transmitted from the ECU 30 using the electric energy of the battery 10.

Figure 2:
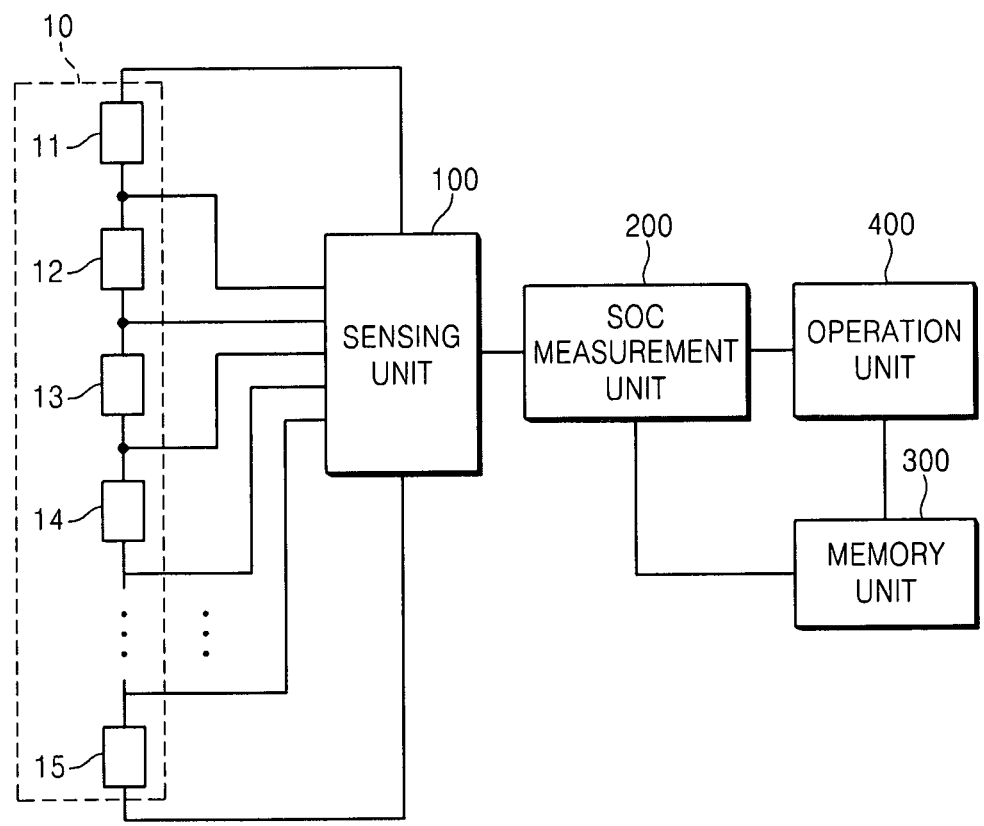
FIG. 2 is a block diagram illustrating a configuration of a battery SOC estimation apparatus according to an embodiment of the present invention.
Figure 5:
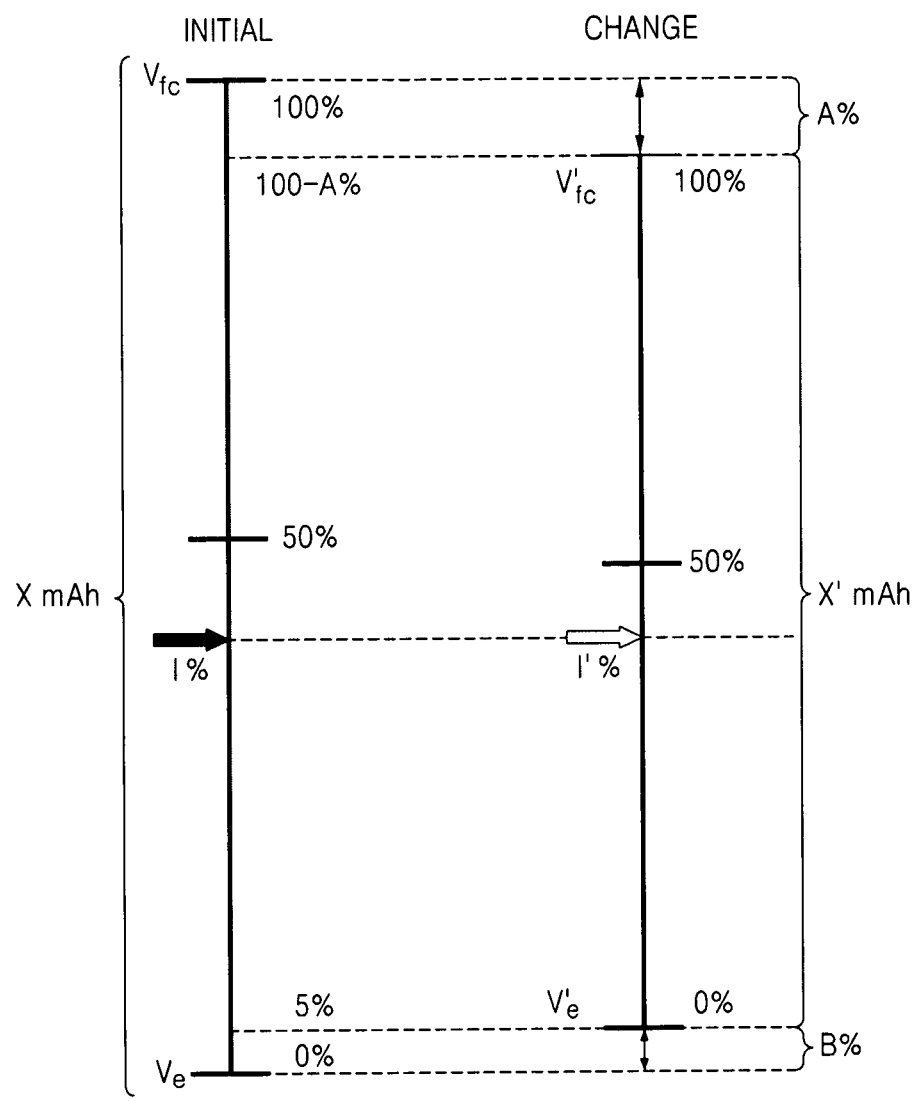
FIG. 5 is a schematic view for explaining an SOC estimation method of a battery according to an embodiment of the present invention.
Figure 6:
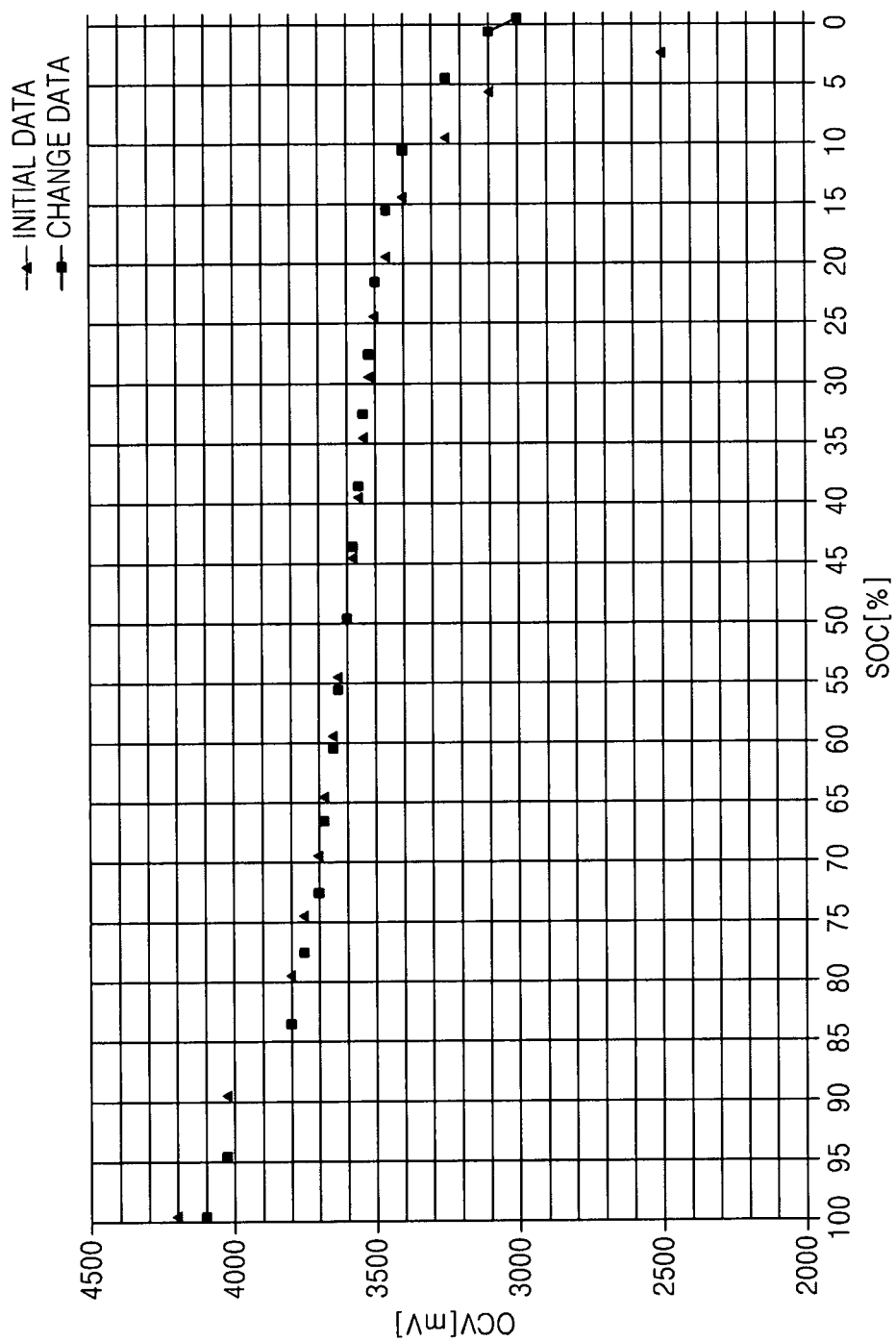
FIG. 6 is a graph comparing the initial OCV table and the changed OCV table data.

FIG. 2 is a block diagram illustrating a configuration of a battery SOC estimation apparatus according to an embodiment of the present invention. That is, FIG. 2 is a block diagram of a apparatus for estimating an initial SOC of a battery and estimating a changed SOC according to a reduction of a voltage range of a user. In addition, FIGS. 3 and 4 are views illustrating an example of an OCV table used in an embodiment of the present invention. FIG. 3 is an exemplary diagram of an initial OCV table. FIG. 4 is an illustration of an OCV table corrected according to the reduction of the operating voltage range according to the present invention. Then, FIG. 5 is a schematic view for explaining an SOC estimation method of a battery according to an embodiment of the present invention. One the other hand, FIG. 6 is a graph comparing the initial OCV table and the changed OCV table data.

Referring to FIG. 2, the SOC estimation apparatus of the battery according to an embodiment of the present invention includes a sensing unit 100 for sensing voltage and current of the battery 10, an SOC estimation unit 200 for estimating the SOC of the battery, a memory unit 300 for storing data such as SOC and voltage of the battery 10, and an operation unit 400 for calculating the degree of SOC reduction due to the change in the use voltage range and recalculating the SOC according to the reduced use range.

First, the battery 10 may include a plurality of battery cells 11, 12, 13, ..., 1n that may be charged and discharged. Here, in relation to the battery 10 an even number of battery cells may be connected or an odd number of battery cells may be connected. That is, n may be an even number or an odd number. Also, the plurality of battery cells may be connected in series. That is, the plurality of battery cells have one terminal and another terminal, and one terminal of one battery cell may be connected to the other terminal of the other battery cell. For example, the cathode of the first battery cell 11 may be connected to the anode of the second battery cell 12, and the cathode of the second battery cell 12 may be connected to the anode of the third battery cell 13. Further, the plurality of battery cells may have the same capacity and accordingly, the maximum charge voltage may be the same. For example, the maximum charge voltage may be 4.2V.

1. Sensing Unit

The sensing unit 100 is provided for sensing the state of the battery 10 and senses the voltage and current of the battery 10, for example. Here, the sensing unit 100 may sense voltage and current of the battery pack, the battery module, and the battery cell. For this, the sensor unit 100 may include a plurality of sensors, for example, at least one voltage sensor (not shown) and at least one current sensor (not shown). The voltage sensor may measure the voltage of at least one of the battery pack, the battery module or the battery cell. For example, a voltage sensor may be used to measure the voltage of a battery pack, and after the BMS is enabled, it is possible to measure the stabilized voltage, i.e. OCV, from the battery pack after a predetermined time. The current sensor may measure the current of the battery pack. The current sensor may include, for example, a Hall current transformer (Hall CT) that measures current using a Hall element and outputs a signal corresponding to the measured current. Meanwhile, the sensing unit 110 may further include a temperature sensor (not shown) for measuring the battery 10 or the ambient temperature. The temperature sensor may measure the temperature of one area or a plurality of areas of the battery pack or the battery module, and at least one temperature sensor may be provided for this purpose. In order to sense the voltage, current, temperature, etc. of the battery 10 using the sensing unit 100, the sensing unit 100 may be connected to the battery 10 through a plurality of connection lines as shown in FIG. 2. For example, each of the plurality of battery cells 11, 12, 13, 14, . . . , 1n may be connected to the sensing unit 100 through a plurality of connection lines. As a specific example of this, the positive electrode of the first battery cell 11 and the sensing unit 100 are connected through a connection line and a point between the first battery cell 11 and the second battery cell 12 is connected to the sensing unit 100 through the connection line. Each of the plurality of battery cells 11, 12, 13, 14, . . . , 1n connected in series is connected to the sensing unit 100 through a connection line, and accordingly, the sensing unit 100 may sense the states of the plurality of battery cells 11, 12, 13, 14, . . . , 1n.

2. SOC Estimation Unit

The SOC estimation unit 200 estimates the SOC of the battery 10. There are various methods to estimate the SOC. For example, the SOC of the battery 10 may be estimated using the capacity of the battery 10 estimated from the SOH estimation unit (not shown) and the current of the battery 10 measured from the sensing unit 100. That is, the SOC estimation unit 200 integrates a current value measured for a predetermined time from the sensing unit 100, and divides it by the estimated battery capacity from the SOH estimation unit to estimate the SOC of the battery 10. Also, the SOC estimation unit 200 may estimate the SOC using the Open Circuit Voltage (OCV) of the battery 10. That is, the SOC may be estimated by referring to the initial OCV table stored in the memory unit 300 and extracting the SOC matched to the OCV measured by the sensing unit 100. For example, if the OCV measured from the sensing unit 100 is 3560 mV, it may be estimated that the SOC is 40% by referring to the OCV table of FIG. 3. Then, the SOC estimation unit 200 may estimate the SOC through various methods for measuring the impedance of the battery 10 and estimating the SOC. The embodiment of the present invention estimates the SOC by matching the OCV measured from the sensing unit 100 with the OCV table stored in the memory unit 300.

3. Memory Unit

The memory unit 300 may store various data for operating the battery 10. In particular, the memory unit 300 may store the SOC and the OCV. At this time, the SOC and the OCV may be matched and stored. That is, various experimentally measured SOCs and corresponding OCVs may be stored in the memory unit 300. For example, as shown in FIG. 3, SOCs ranging from 0% to 100% and OCVs according to respective SOCs may be measured, and they may be matched and stored. The SOC and OCV stored in the memory unit 300 may be measured and stored in various ways. As one method, for example, the battery cell of the same specification as that of the battery cell used as the battery 10 of the present invention is charged with 0.5 C and 50 mA cutoff from 3 V to 4.2 V, maintained for 5 hours, and then discharged to 3 V with 0.01 C. The voltage of the battery cell is periodically measured during discharge. This process is repeated a plurality of times, for example, 7 to 8 times, so that SOC and OCV averages are calculated to provide SOC and OCV tables. As another method, the charge OCV is measured periodically while the battery cell is charged to 0.001 C (i.e., charged for 1000 hours), and the discharging OCV is periodically measured while discharged to 0.001 C (i.e., discharged for 1000 hours). The SOC and OCV tables may be prepared by calculating the average of the charge OCV and the discharge OCV and calculating the SOC at this time. As another method, the cylindrical battery cell is fully fixed using a mechanical fixture, and the + and − terminals of the charger and loader are contacted with the + and − terminals of the cylindrical battery cell using a screw. After a plurality of sets of structures in which the battery cells are in contact with the charger and the loader are manufactured and are placed in a constant temperature and humidity chamber to extract the SOC and OCV at a constant temperature. On the other hand, OCV and SOC are matched and stored, and the temperature and internal resistance at this time may also be stored. That is, the memory unit 300 may separately obtain the capacity decrease coefficient depending on the ambient temperature of the battery, the internal resistance, or the temperature, and store it in advance. In addition, the newly corrected OCV and SOC according to a change in a use voltage range may be matched and stored in the memory unit 300. For example, as shown in FIG. 4, the newly estimated SOC and the corresponding OCV may be matched and stored according to the reduction of the use voltage range. At this time, the newly corrected OCV table may be stored by updating the initial OCV table or may be stored separately from the initial OCV table. That is, newly calculated SOC and OCV data may be overwritten and stored in the initial OCV table, or a new OCV table may be stored as data separate from the initial OCV table. Meanwhile, the memory unit 300 may be provided in the BMS 20, and may be separately provided in addition to the BMS 20. The memory unit 300 may include nonvolatile memory such as a hard disk drive, a flash memory, an electrically erasable programmable read-only memory (EEPROM), a static random access memory (SRAM), a ferroelectric random access memory (FRAM), and a phase change random access memory (PRAM).

4. Operation Unit

The operation unit 400 calculates an SOC reduction degree according to the change of the use voltage range and re-calculates the SOC accordingly. For this, the operation unit 400 first calculates the degree of SOC reduction using the upper and lower of the use voltage range according to the use voltage range change. That is, the operation unit 400 detects the upper and lower levels of the use voltage range by referring to the initial OCV table of the memory unit 300, and calculates the degree of SOC reduction according to the detected OCV table. For example, if the use voltage range is 4.0 V to 2.4 V, the OCV table of FIG. 3 is referenced to detect the SOC according to the voltage, that is, 90% and 5% and accordingly it is calculated that the degree of SOC reduction is the upper 10% and the lower 5%. Also, the operation unit 400 calculates the changed capacity by subtracting the FCC capacity from the initial capacity by the degree of SOC reduction, and calculates a new SOC according to the reduced use range. Here, the operation unit 400 calculates the changed capacity using Equation 1, and calculates the changed SOC using Equation 2.

$$X'[mAh] = X[mAh] \times (1 - (A \% + B \%))  \quad \text{[Equation 1]}$$

$$I'[\%] = \frac{(I \% - B \%)}{(100\% - (A \% + B \%))} \quad \text{[Equation 2]}$$

A schematic diagram for calculating the changed capacity X' and the changed SOC I' is shown in FIG. 5. As shown in FIG. 5, the maximum voltage and the minimum voltage are denoted by Vfc and Ve, respectively, and the maximum and minimum SOC are 100% and 0%, respectively. In addition, the upper and lower capacity subtraction rates are denoted by A % and B %, respectively, and the initial and changed SOC are denoted by I and I', respectively. Then, the changed maximum voltage and minimum voltage are denoted by V'fc and V'e, respectively. As shown in Equation 1, the changed capacity X' may be calculated by multiplying the initial capacity X by a value obtained by subtracting 1 from the sum of the upper capacity reduction ratio A % and the lower capacity reduction ratio B %. In addition, as shown in Equation 2, the changed SOC I' is calculated by dividing a value obtained by subtracting the lower capacity reduction ratio B % from the initial SOC I by a value obtained by subtracting the sum of the upper capacity subtraction rate A % and the lower capacity subtraction rate B % from 100%. For example, under the assumption that the maximum and minimum voltages are 4.2 V and 2.0 V, the initial SOC is 40%, and the high capacity reduction ratio A % and the low capacity reduction ratio B % are 10% and 5%, respectively, the changed capacity is calculated as 1275 mAh by Equation 1, and the changed SOC is calculated as 41% by Equation 2. Table 1 shows examples of the changed capacity and SOC calculated by Equations 1 and 2 according to initial capacity and initial SOC and upper and lower capacity subtraction rates.

TABLE 1

|  | Example 1 | Example 2 | Example 3 | Example 4 | Example 5 | Example 6 | Example 7 |
| --- | --- | --- | --- | --- | --- | --- | --- |
| Initial capacity (mAh) | 1500 | 3000 | 2800 | 2200 | 3000 | 2400 | 2400 |
| Upper capacity subtraction rate (%) | 10% | 15% | 7% | 0% | 2% | 10% | 10% |
| Lower capacity subtraction rate (%) | 5% | 3% | 0% | 7% | 8% | 3% | 3% |
| Initial SOC(%) | 40% | 60% | 55% | 64% | 60% | 95% | 2% |
| Changed capacity (mAh) | 1275 | 2460 | 2604 | 2046 | 2700 | 2088 | 2088 |
| Changed SOC(%) | 41% | 70% | 59% | 61% | 58% | 106% | −1% |

However, when the changed SOC exceeds the reduced range, it is calculated as over SOC or under SOC. That is, as shown in Example 6, since the changed SOC is 11% larger than the initial SOC, which exceeds the reduction range of 10%, it is calculated as over SOC, and as shown in Example 7, the changed SOC is 3% smaller than the initial SOC, which is the same as the reduced range 3%, it is calculated as under SOC. On the other hand, the operation unit 400 calculates the SOC and the OCV according thereto depending on the calculated use voltage change, that is, use voltage reduction, and stores them in the memory unit 300. That is, the newly calculated OCV table is updated and stored in the existing OCV table. At this time, the new data may be stored in the form of overwriting the existing data or may be stored as data separate from the existing data. In the new OCV table, the maximum voltage 4V set by the user is set to SOC 100%, the minimum voltage 2.4V is set to SOC 0%, and the SOC due to OCV therebetween may be calculated and stored as Equation 1. An example of such a new OCV table is shown in FIG. 4, and a graph comparing the initial OCV table and the changed OCV table data is shown in FIG. 6.

As described above, the SOC estimation apparatus for a battery according to an embodiment of the present invention includes a sensing unit 100, an SOC estimation unit 200, a memory unit 300, and an operation unit 400. Depending on the needs of a manufacturer that mounts the battery in a vehicle, the capacity of the battery whose use voltage range is changed may be estimated using the initial SOC of the OCV table. For example, the use voltage range may be changed according to the manufacturer's request for the battery having the use voltage range set as the manufacturing of the battery is completing. In this case, the current voltage SOC is calculated by referring to the OCV table, and the upper and lower voltage use ranges of the manufacturer are calculated by referring to the OCV table. FCC capacity is calculated by deducting the reduction amount, and a new SOC corresponding to the reduced use range is re-calculated. Therefore, it is possible to prevent the occurrence of an error by estimating the changed SOC according to the reduction of the voltage range of the user, thereby enabling stable use of the battery.

Figure 7:
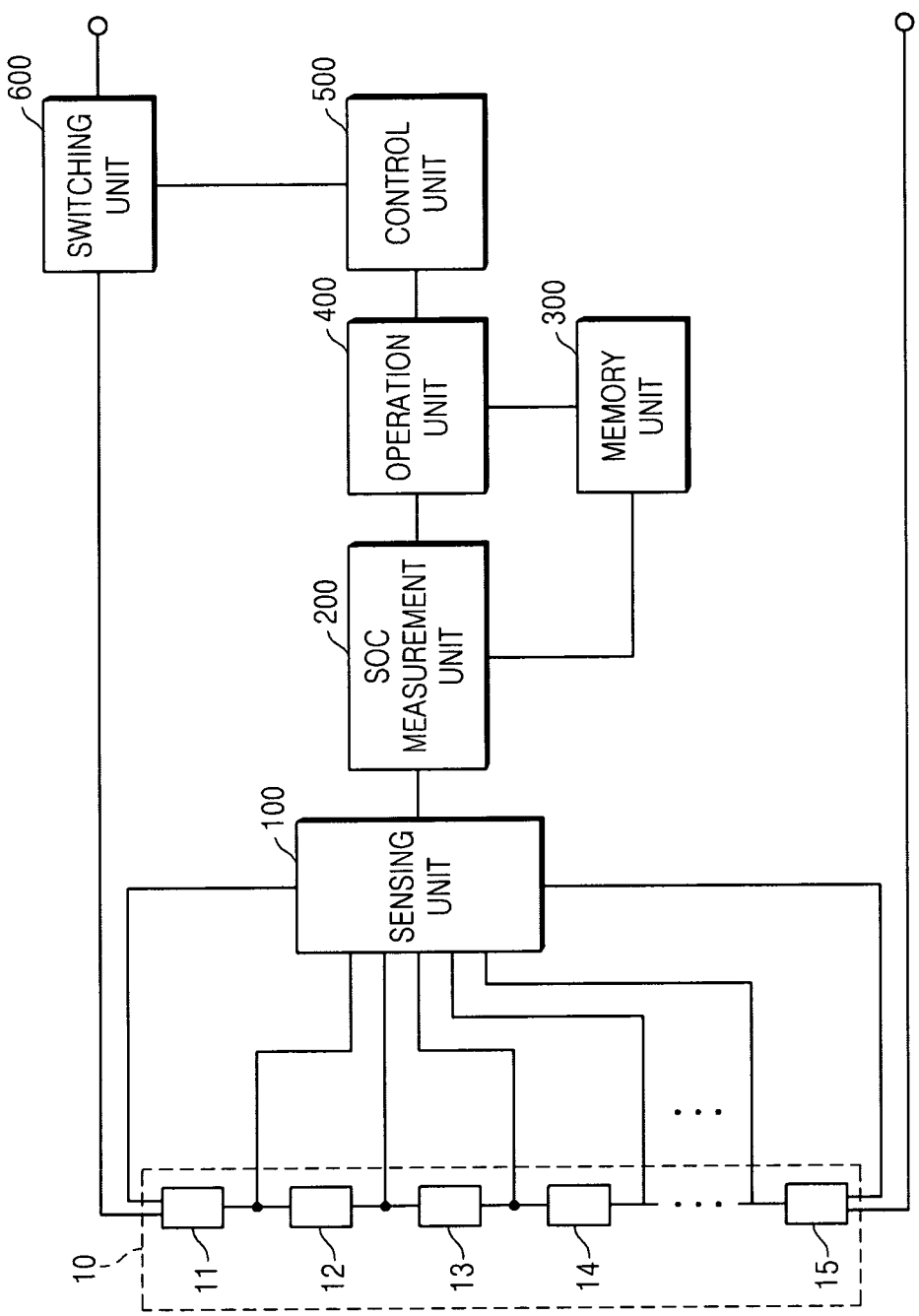
FIGS. 7 and 8 are block diagrams of a battery management apparatus according to an embodiment of the present invention.
Figure 8:
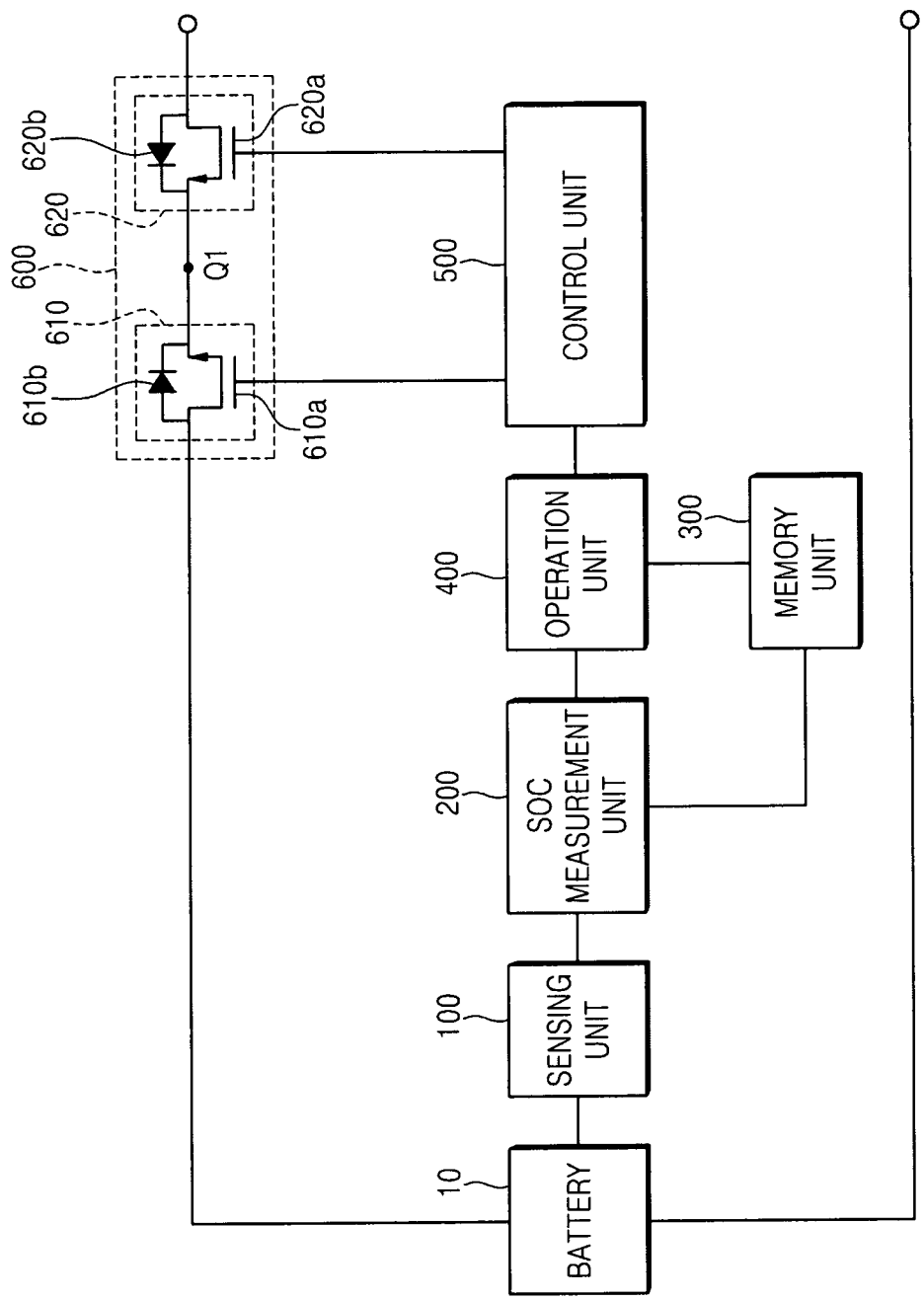

Meanwhile, the capacity of the battery 10 whose use voltage range is changed as described above may be estimated using the SOC estimation apparatus of the present invention, and the battery 10 whose use voltage range has been changed may be charged and discharged using the battery management apparatus. FIGS. 7 and 8 show a battery management apparatus including the SOC estimation apparatus of the present invention. FIG. 7 is a block diagram of a battery management apparatus according to an embodiment of the present invention, and FIG. 8 is a block diagram of a battery management apparatus for explaining a configuration of a switching unit of a battery management apparatus.

Referring to FIG. 7, a battery management apparatus according to an exemplary embodiment of the present invention includes a battery 10 including a plurality of battery cells 11, 12, 13, 14, . . . , 1n, a sensing unit 100 for sensing the state of the battery 10, an SOC estimation unit 200 for estimating an SOC of the battery, a memory unit 300 for storing data such as SOC and voltage of the battery 10, an operation unit 400 for calculating the degree of SOC reduction according to the use voltage range change and outputting the SOC according to the reduced use range, a control unit 500 for controlling the charging and discharging of the battery 10 according to the state of the battery 10 with reference to the re-calculated SOC, and a switching unit 600 for controlling the connection between the battery 10 and the load according to a control signal of the control unit 500. That is, the battery management apparatus of the present invention is configured further including a control unit 500 and a switching unit 600 in the SOC estimation apparatus including the sensing unit 100, the SOC estimation unit 200, and the operation unit 400. Here, since the SOC estimation apparatus has already been described, the control unit 500 and the switching unit 600 of the battery management apparatus of the present invention will be described in detail as follows.

5. Control Unit

The control unit 500 generates a control signal according to the voltage of each of the plurality of battery cells measured by the sensing unit 100 to control the switching unit 600 between the battery 10 and the load, thereby controlling the charging/discharging of the battery 10. Therefore, overcharge or overdischarge of the battery cell may be prevented. For example, the control unit 500 compares the first set voltage for stopping the charging operation and the second set voltage for performing the charging operation with the voltages of the plurality of battery cells measured by the sensing unit 100. If the measured voltage is higher than or equal to the first set voltage, the control unit 500 generates a control signal for stopping the charging operation of the battery cell, and if the measured voltage is lower than or equal to the second set voltage, the control unit 500 may generate a control signal for charging operation of the battery cell. Here, when the maximum charging voltage of each of the plurality of battery cells is 4.0 V, in order to prevent overcharging, for example, the first set voltage may be set to 3.8V. The second set voltage may be set to, for example, 2.4 V to prevent over discharge of each of the plurality of battery cells. In addition, the control unit 500 may control the charging/discharging of the battery cell by changing the set voltage of the battery cell according to the changed capacity of the battery cell. For example, when the maximum charge voltage is changed from 4.0V to 3.8V and the minimum voltage is changed to 2.5V, the control unit 500 may change the first and second set voltages and compare the data with the data of the memory cell using the operation result of the operation unit 400 or the data updated and stored in the memory unit 300. For example, when the first set voltage is changed to 3.8V and the minimum charge voltage is changed to 2.5V, the first set voltage is changed to 3.6 V and the minimum charge voltage is changed to 2.6 V and compared with the data of the memory cell. Therefore, it is possible to control the charging and discharging of the battery cell according to the change of the maximum charging voltage and the minimum charging voltage of the battery cell, thereby preventing overcharge and overdischarge of the changed battery cell.

6. Switching Unit

The switching unit 600 is provided between a current path between the battery 10 and the load, and controls the charging and discharging of the battery 10 by the control unit 500. The switching unit 600 may include a first switch 610 and a second switch 620 as shown in FIG. 8. That is, the switching unit 600 is provided between the battery 10 and the load. The first switch 610 may be provided on the side of the battery 10 and the second switch 620 may be provided on the load side. The first and second switches 610 and 620 are driven according to the control signal generated by the control unit 500 and may be driven at the same time when the battery 10 is charged and discharged and either one of them may be driven. For example, the first switch 610 may be driven when the battery 10 is charged, and the second switch 620 may be driven when the battery 10 is discharged. Here, the load may include an external power source for charging the battery 10, and an electronic device to which the battery 10 driven according to the discharge voltage of the battery 10 is mounted. That is, when the battery 10 is charged, the battery 10 may be connected to an external power source, and when the battery 10 is discharged, the battery 10 may be connected to the electronic device.

The first switch 610 may include a first FET 610*a* and a first parasitic diode 610*b*. The first FET 610*a* has a source terminal and a drain terminal provided between the battery 10 and the first node Q1 and a gate terminal is connected to the control unit 500. Accordingly, the first FET 610*a* is driven according to a control signal output from the controller 500, and functions to apply a current to the battery 10 during charging. The first parasitic diode 610*b* is connected in parallel to the first FET 610*a*. That is, the first parasitic diode 610*b* is connected in a forward direction between the battery 10 and the first node Q1. This first parasitic diode 610*b* sets the discharge path of the battery 10 when the first FET 610*a* is turned off. That is, the battery 10 may be charged through the first FET 610*a*, and the battery 10 may be discharged through the first parasitic diode 610*b*.

The second switch 620 may include a second FET 620*a* and a second parasitic diode 620*b*. The second FET 620*a* has a source terminal and a drain terminal provided between the first node Q1 and the load, and a gate terminal connected to the control unit 500. Accordingly, the second FET 620*a* is driven according to a control signal output from the controller 500, and functions to apply the discharge current of the battery 10 to the connected electronic device during the discharge. The second parasitic diode 620*b* is connected in parallel to the second FET 620*a*. That is, the second parasitic diode 620*b* is connected in the reverse direction between the first node Q1 and the load. The second parasitic diode 620*b* sets the path of the charging current when the battery 10 is charged. That is, the battery 10 may be charged through the first FET 620*a*, and the battery 10 may be discharged through the first parasitic diode 610*b*.

In relation to the switching unit 600, the control unit 500 is connected to the gate terminal of the first FET 610*a* and the gate terminal of the second FET 620*a*, so that the first and second FETs 610*a* and 620*a* are driven according to a control signal outputted from the control unit 500, respectively. The control unit 500 turns on the first FET 610*a* and turns off the second FET 620*b* when the battery 10 is charged. Thus, the battery 10 is charged from the load, i.e., the external power supply, through the second parasitic diode 620*b* and the first FET 610*a*. In addition, the controller 500 turns on the second FET 620*a* and turns on the second FET 610*a* when the battery 10 is discharged. Thus, the battery 10 is discharged from the battery 10 through the first FET 610*a* and the second parasitic diode 620*b*. At this time, the control signal for turning on the first and second FETs 610*a* and 620*a*, respectively, may be a logic high signal, and the control signal for turning off the first and second FETs 610*a* and 620*a*, respectively, may be a logic low signal.

As described above, the battery control apparatus according to an embodiment of the present invention may control the charging/discharging of the battery 10 after sensing the state of the battery 10. Also, the battery control apparatus may control the charging/discharging of the battery 10 according to the capacity of the battery 10 changed after the capacity and SOC of the battery 10 are changed by the SOC estimation apparatus. When the capacity of the battery 10 is reduced, the charging/discharging of the battery may be controlled by lowering the set voltage according to the reduced capacity.

Figure 9:
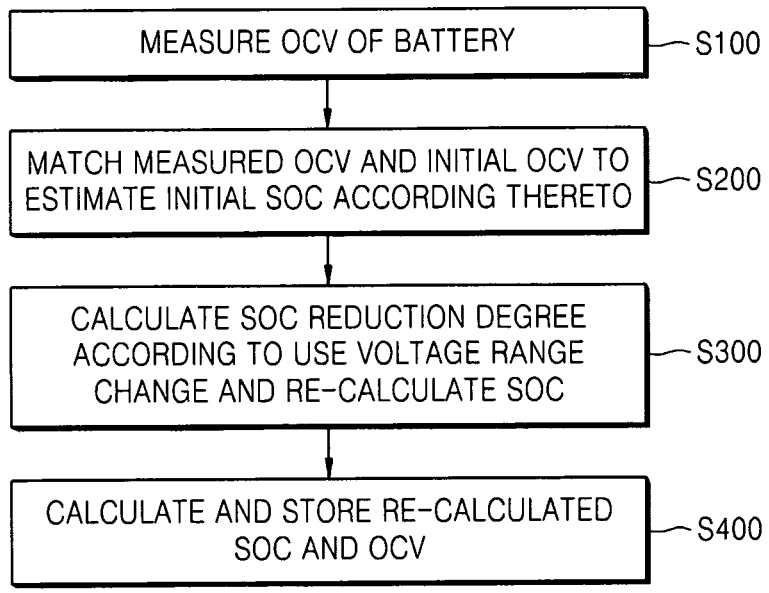
FIG. 9 is a schematic view for explaining an SOC estimation method of a battery according to an embodiment of the present invention.
Figure 10:
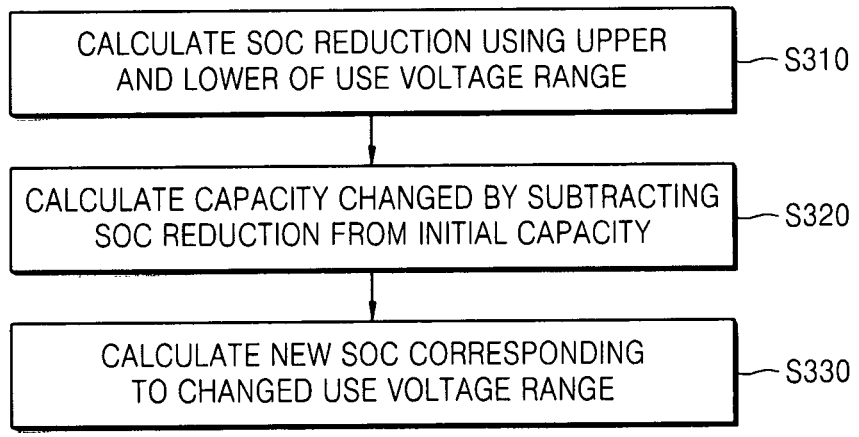
FIG. 10 is a flowchart of a SOC estimation method of a battery according to an embodiment of the present invention.

FIG. 9 is a flowchart illustrating an SOC estimation method according to an embodiment of the present invention, and FIG. 10 is a detailed flowchart of a process.

Referring to FIGS. 9 and 10, the SOC estimation method according to an embodiment of the present invention includes measuring OCV and current of the battery 10 (S100), matching the measured OCV with an initial OCV stored in the memory unit 300 and extracting an initial SOC according to the initial OCV (S200), calculating the degree of SOC reduction according to the use voltage range change and re-calculating the SOC according to the reduced use range (S300), and calculating and storing the calculated SOC and OCV according to the use voltage reduction (S400). In addition, the re-calculating of the SOC S300 may include calculating the degree of SOC reduction using the upper and lower use voltage ranges according to the use voltage range change (S310), calculating the changed capacity by subtracting the FCC capacity from the initial capacity by the degree of SOC reduction (S320), and calculating a new SOC corresponding to the reduced use range (S330). The SOC estimation method according to an embodiment of the present invention will now be described in detail.

S100: The voltage of the battery 10 is measured using the sensing unit 100. That is, the voltage, that is, the OCV, which is stabilized after a predetermined time from the battery pack after the BMS is enabled by using the voltage sensor, is measured. Also, the sensing unit 100 may measure the current of the battery pack using a current sensor.

S200: The SOC estimation unit 200 matches the measurement OCV with the initial OCV stored in the memory unit 300 and estimates an initial SOC according thereto. Various data for operating the battery 10 may be stored in the memory unit 300, and in particular, various experimentally measured initial SOCs and corresponding initial OCVs may be matched and stored. For example, the SOC from 0% to 100% and the OCV according to each SOC may be measured, and they are matched and stored as shown in FIG. 3. Therefore, the OCV measured from the sensing unit 100 may be compared with the initial OCV stored in the memory unit 300, and the initial SOC may be extracted accordingly.

S300: The operation unit 400 calculates the degree of SOC reduction according to the use voltage range change and re-calculates the SOC according to the reduced use range. The SOC re-calculation process according to the change of the use voltage range is as shown in FIG. 7 as follows.

S310: The operation unit 400 calculates the degree of SOC reduction using the upper and lower of the use voltage range according to the use voltage range change. That is, the operation unit 400 calculates the degree of SOC reduction by referring to the upper and lower of the use voltage range of the initial OCV table of the memory unit 300. For example, if the use voltage range is 4.0 V to 2.4 V, the OCV table of FIG. 3 is referenced to detect the SOC according to the voltage, that is, 90% and 5% and accordingly it is calculated that the degree of SOC reduction is the upper 10% and the lower 5%.

S320 and S330: The operation unit 400 calculates the changed capacity by subtracting the FCC capacity from the initial capacity by the degree of SOC reduction, and calculates a new SOC according to the reduced use range. Here, the operation unit 400 calculates the changed capacity using Equation 1, and calculates the changed SOC using Equation 2. As shown in Equation 1, the modified capacity X' may be calculated by multiplying the initial capacity X by a value obtained by subtracting 1 from the sum of the upper capacity reduction ratio A % and the lower capacity reduction ratio B %. In addition, as shown in Equation 2, the changed SOC I' is calculated by dividing a value obtained by subtracting the lower capacity reduction ratio B % from the initial SOC I by a value obtained by subtracting the sum of the upper capacity subtraction rate A % and the lower capacity subtraction rate B % from 100%. For example, under the assumption that the maximum and minimum voltages are 4.2 V and 2.0 V, the initial SOC is 40%, and the high capacity reduction ratio A % and the low capacity reduction ratio B % are 10% and 5%, respectively, the modified capacity is calculated as 1275 mAh by Equation 1, and the modified SOC is calculated as 41% by Equation 2.

S400: The operation unit 400 calculates the SOC and the OCV according thereto depending on the calculated use voltage change, and they are stored in the memory unit 300. That is, the newly calculated OCV table is updated and stored in the existing OCV table. At this time, the new data may be stored in the form of overwriting the existing data or may be stored as data separate from the existing data. In the new OCV table, the maximum voltage 4V set by the user is set to SOC 100%, the minimum voltage 2.4V is set to SOC 0%, and the SOC due to OCV therebetween may be calculated and stored as Equation 1. An example of this new OCV table is shown in FIG. 4.

Meanwhile, the capacity of the battery 10 whose use voltage range is changed as described above may be estimated using the SOC estimation apparatus shown in FIGS. 7 and 8, and the battery 10 whose use voltage range has been changed may be charged and discharged using the battery management apparatus. That is, the control unit 500 may control the charging/discharging of the battery cell by changing the set voltage of the battery cell according to the changed capacity of the battery cell. For example, when the maximum charge voltage is changed from 4.0V to 3.8V and the minimum voltage is changed to 2.5V, the control unit 500 may change the first and second set voltages and compare the data with the data of the memory cell using the operation result of the operation unit 400 or the data updated and stored in the memory unit 300, and then, may control charging/discharging of the battery cell. That is, it is possible to control the charging and discharging of the battery cell according to the change of the maximum charging voltage and the minimum charging voltage of the battery cell, thereby preventing overcharge and overdischarge of the changed battery cell.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. A battery capacity estimation apparatus comprising:
a battery;
a sensing unit connected to the battery to measure an OCV of the battery;
an SOC estimation unit connected to the sensing unit to estimate an SOC of the battery using the OCV measured from the sensing unit;
a memory unit configured to store data including the SOC and the OCV of the battery, the memory unit being connected to the SOC estimation unit; and
an operation unit connected to the SOC estimation unit and the memory unit, the operation unit being configured to calculate an SOC reduction degree according to a use voltage range change and re-calculate a changed SOC based on a changed use capacity of the battery,
wherein the use voltage range change is a reduction in usable voltage of the battery from an initial voltage range of the battery and is based on the changed use capacity of the battery, and wherein the changed use capacity of the battery is a reduction in a usable capacity of the battery from an initial usable capacity of the battery.

2. The apparatus of claim 1, wherein the memory unit matches and stores a plurality of initial SOCs and a plurality of initial OCVs, and matches and stores a plurality of changed SOCs and a plurality of changed OCVs.

3. The apparatus of claim 1, wherein the operation unit calculates a changed capacity by [Equation 1] below.

$$X'[mAh] = X[mAh] \times (1-(A\%+B\%)) \qquad \text{[Equation 1]}$$

where X' is a changed capacity, X is an initial capacity, A and B are high and low capacity subtraction ratios, respectively.

4. The apparatus of claim 3, wherein the operation unit calculates a changed SOC by [Equation 2] below $$I'[\%] = \frac{(I\% - B\%)}{(100\% - (A\% + B\%))} \qquad \text{[Equation 2]}$$

where I' is a changed SOC, I is an initial SOC, A and B are high and low capacity subtraction ratios, respectively.

5. A battery management apparatus comprising:
a battery;
a sensing unit connected to the battery to measure an OCV of the battery;
an SOC estimation unit connected to the sensing unit to estimate an SOC of the battery using the OCV measured from the sensing unit;
a memory unit configured to store data including the SOC and the OCV of the battery, the memory unit being connected to the SOC estimation unit;
an operation unit connected to the SOC estimation unit and the memory unit and configured to calculate an SOC reduction degree according to a use voltage range change and re-calculate a changed SOC based on a changed use capacity;
a control unit connected to at least one of the operation unit and the memory unit to control charging and discharging of the battery according to a state of the battery based on the re-calculated changed SOC; and
a switching unit provided between the battery and a load to charge/discharge the battery according to a control signal of the control unit,
wherein the use voltage range change is a reduction in usable voltage of the battery from an initial voltage range of the battery and is based on the changed use capacity of the battery, and
wherein the changed use capacity of the battery is a reduction in a usable capacity of the battery from an initial usable capacity of the battery.

6. The apparatus of claim 5, wherein the operation unit calculates a changed capacity by [Equation 1] below and calculates a changed SOC by [Equation 2] below $$X'[mAh] = X[mAh] \times (1-(A\%+B\%)) \qquad \text{[Equation 1]}$$

where X' is a changed capacity, X is an initial capacity, A and B are high and low capacity subtraction ratios, respectively, $$I'[\%] = \frac{(I\% - B\%)}{(100\% - (A\% + B\%))} \qquad \text{[Equation 2]}$$

where I' is a changed SOC, I is an initial SOC, A and B are high and low capacity subtraction ratios, respectively.

7. A battery capacity estimation method comprising:
measuring an OCV of a battery;
estimating an initial SOC according to the measured OCV;
calculating a changed SOC after calculating a SOC reduction degree according to a use voltage range change; and
calculating a changed OCV according to the changed SOC,
wherein the use voltage range change is a reduction in usable voltage of the battery from an initial voltage range of the battery and is based on the changed use capacity of the battery, and
wherein the changed use capacity of the battery is a reduction in a usable capacity of the battery from an initial usable capacity of the battery.

8. The method of claim 7, further comprising matching and storing a plurality of initial SOCs of the battery and a plurality of initial OCVs according thereto.

9. The method of claim 8, wherein the initial SOC is estimated by matching the measured OCV and the initial OCV.

10. The method of claim 7, wherein the calculating of the changed SOC comprises:
calculating a SOC change degree according to the use voltage range change;
calculating a changed capacity by subtracting from the initial capacity by the SOC change degree; and
calculating the changed SOC.

11. The method of claim 10, wherein the changed capacity is calculated by [Equation 1] below $$X'[mAh] = X[mAh] \times (1-(A\%+B\%)) \qquad \text{[Equation 1]}$$

where X' is a changed capacity, X is an initial capacity, A and B are high and low capacity subtraction ratios, respectively.

12. The method of claim 10, wherein the changed SOC is calculated by [Equation 2] below $$I'[\%] = \frac{(I\% - B\%)}{(100\% - (A\% + B\%))} \qquad \text{[Equation 2]}$$

where I' is a changed SOC, I is an initial SOC, A and B are high and low capacity subtraction ratios, respectively.

13. The method of claim 7, further comprising storing a plurality of data by matching the changed SOC and the changed OCV.

14. A battery management method comprising:
measuring an OCV of a battery;
estimating an initial SOC according to the measured OCV;
calculating a changed SOC after calculating a SOC reduction degree according to a use voltage range change;
calculating a changed OCV according to the changed SOC; and
controlling charging/discharging of the battery according to the state of the battery based on the changed SOC,
wherein the use voltage range change is a reduction in usable voltage of the battery from an initial voltage range of the battery and is based on the changed use capacity of the battery, and wherein the changed use capacity of the battery is a reduction in a usable capacity of the battery from an initial usable capacity of the battery.

15. The method of claim 14, wherein the calculating of the changed SOC comprises:
   calculating a SOC change degree according to the use voltage range change;
   calculating a changed capacity by subtracting from the initial capacity by the SOC change degree; and
   calculating the changed SOC.

16. The method of claim 15, wherein the changed capacity is calculated by [Equation 1] below and the changed SOC is calculated by [Equation 2] below $$X'[mAh] = X[mAh] \times (1-(A\%+B\%)) \quad \text{[Equation 1]}$$

where X' is a changed capacity, X is an initial capacity, A and B are high and low capacity subtraction ratios, respectively, and $$I'[\%] = \frac{(I\% - B\%)}{(100\% - (A\% + B\%))} \quad \text{[Equation 2]}$$

where I' is a changed SOC, I is an initial SOC, A and B are high and low capacity subtraction ratios, respectively.

17. The apparatus of claim 1, wherein the use voltage range is less than an original voltage range of the battery.

18. The apparatus of claim 5, wherein the use voltage range is less than an original voltage range of the battery.

19. The method of claim 7, wherein the use voltage range is less than an original voltage range of the battery.

20. The method of claim 14, wherein the use voltage range is less than an original voltage range of the battery.

* * * * *